United States Patent
Carlini

(10) Patent No.: US 6,867,590 B2
(45) Date of Patent: Mar. 15, 2005

(54) METHOD OF COMPENSATING FOR GRADIENT INDUCED EDDY CURRENTS IN NMR IMAGING APPARATUSES

(75) Inventor: Davide Carlini, Genoa (IT)

(73) Assignee: Esaote S.p.A., Casale Monferrato (IT)

( * ) Notice: Subject to any disclaimer, the term of this patent is extended or adjusted under 35 U.S.C. 154(b) by 0 days.

(21) Appl. No.: 10/609,570

(22) Filed: Jul. 1, 2003

(65) Prior Publication Data

US 2004/0046554 A1 Mar. 11, 2004

(30) Foreign Application Priority Data

Jul. 1, 2002 (IT) ................................... SV2002A0030

(51) Int. Cl.$^7$ ................................................. G01V 3/00
(52) U.S. Cl. ..................................................... 324/309
(58) Field of Search .............................. 324/309, 307, 324/318, 322, 314, 319

(56) References Cited

U.S. PATENT DOCUMENTS

| | | | |
|---|---|---|---|
| 4,698,591 A | | 10/1987 | Glover et al. |
| 4,890,061 A | | 12/1989 | Den Boef |
| 5,332,969 A | * | 7/1994 | Tsuruno et al. ............. 324/309 |
| 6,448,773 B1 | * | 9/2002 | Zhang ......................... 324/309 |

FOREIGN PATENT DOCUMENTS

| | | |
|---|---|---|
| EP | 0 228 056 A2 | 7/1987 |
| EP | 0 307 516 A1 | 3/1989 |

OTHER PUBLICATIONS

P. Jehenson et al. "Analytical Method for the Compensation of Eddy–Current Effects Induced by Pulsed Magnetic Filed Gradients in NMR System", Journal of Magnetic Resonances, vol. 90, pp. 264–278, Nov. 1990.

* cited by examiner

Primary Examiner—Brij B. Shrivastav
(74) Attorney, Agent, or Firm—Burns, Doane, Swecker & Mathis, L.L.P.

(57) ABSTRACT

A method of compensating for eddy currents induced by the switching on and off magnetic fields in gradient coils in NMR imaging apparatuses, which method includes at least one compensation cycle including the steps of performing at least one detection of the magnetic field generated by the current flowing in a gradient coil, i.e., a gradient field; extrapolating the course of the effectively generated gradient field from the data of said at least one detection; generating a gradient fields excitation current compensating the eddy current effects on the gradient fields on the basis of the comparison of the effectively generated gradient fields and of the target gradient field.

28 Claims, 5 Drawing Sheets

SECOND COMPENSATION CYCLE ZERO ORDER COMPONENT

Detected zero order
component 1st Compensation

New zero order component
for 2nd Compensation

Detected zero order
component no Compensation

Detected zero order
component 2nd' Compensation

METHOD OF COMPENSATING FOR GRADIENT INDUCED EDDY CURRENTS IN NMR IMAGING APPARATUSES

BACKGROUND OF THE INVENTION

The invention relates to a method of compensating for eddy currents induced by the switching on and off magnetic fields in gradient coils in NMR imaging apparatuses, which method includes at least one compensation cycle comprising the following steps:

a) Performing at least one detection of the magnetic field generated by the current flowing in a gradient coil, i.e., a gradient field b) Extrapolating the course of the effectively generated gradient field from the data of said at least one detection;

c) Generating a gradient fields excitation current compensating the eddy current effects on the gradient fields on the basis of the comparison of the effectively generated gradient fields and of the target gradient field.

Gradient coils are coils that are used, for instance in NMR imaging apparatuses, for generating magnetic fields varying in space along a certain direction.

In order to execute as short imaging sequences as possible, the switching of and off of gradient coils is very fast. This induces fast changing exciting currents and generates eddy currents in the ascending and descending slopes of the switching currents, which hinder the generation of the desired magnetic field in the desired time. This has negative effects on the imaging quality and requires correction.

Eddy current induced magnetic fields are known to be time and space varying fields, that may be defined by a three-dimensional coordinate system, i.e., having three coordinates. The mathematical description of the field referred to the coordinates may consist in a polynomial expansion in which, for each of the three coordinates, zero orders, linear orders and nonlinear orders are provided.

Even when only zero and linear components are considered (zero components and one, i.e., linear, components, are of the zero and one order with respect to the coordinate) with respect to each coordinate, the presence of both orders prevents eddy current effects on the gradient coil field from being effectively compensated for, by only measuring these effects in a predetermined location in space or in a limited region of the whole volume being considered.

A single measurement, intended as a measurement of the field at a single point in the space permeated by the field would not allow to determine both zero and linear components, since any correction or compensation that only accounts for the information retrieved from a single measurement (as defined above) would lead to inaccurate results, in that the correction would only apply, on an average, to the whole partial space volume relative to that measurement and not in a wider volume, like the whole volume being considered.

Generally only one correction step comprising extrapolating the magnetic field of the gradient coils along each one of the three coordinates of spatial direction during excitation, comparing the extrapolated gradient fields with the theoretical ones and using the differences between extrapolated fields and theoretical fields for modifying the time dependent excitations currents of the gradient coils in such a way as to cancel or minimize the said differences, is not sufficient in order to fully compensate the effects on the gradient fields due to the eddy currents and the said steps has to be repeated a certain number of times.

Each repetition requests again the measurement of the gradient fields generated by the gradient coils. Since this measurement requests to carry out at least two measures at different points in the space permeated by the gradient field and since this two measures has to be repeated for each of the three coordinates defining the space, the compensation of the eddy currents requests very long time to be carried out since a certain satisfying level of compensation has been reached.

Furthermore if one considers that as taught by "Anlytical Method for the Compensation of Eddy-Current Effects Induced by Pulsed Magnetic Field Gradients in NMR Systema" by P.Jehenson, M. Westphal, N. Schuff, Journal of Magnetic Resonance, Vol 90, 1990 pages 264–278, the linear components of the magnetic fields corresponding to the gradient fields and the zero order components of the magnetic fields corresponding to a constant magnetic field has to be compensated separately by such a recursive method it clearly appears how important it is to reduce the time needed for carrying out the compensation proceeding.

The above mentioned document teaches to carry out compensation by separating the linear components of the field from the zero order components of the field and by applying a recursive compensation algorithm at each compensation cycle being necessary to carry out a new measurement of the effective gradient fields generated.

OBJECTS AND SUMMARY

The present invention aims to improve the known methods for compensating eddy-currents by reducing the time needed to carry out the compensation proceeding and by allowing to reach a satisfying compensation of the eddy currents effects.

Furthermore the object of the invention is to provide a method for compensating for eddy currents induced by the,switching on and off of magnetic fields in gradient coils in NMR imaging apparatuses as described hereinbefore, which allows also to separate, determine and accurately compensate for the components of each zero order and linear order space coordinate of the eddy current induced field, thereby obtaining a magnetic field that is as close as possible to the ideal field.

The invention achieves the above purposes by providing a method for compensating the effect of the eddy currents induced by fast gradient switch in NMR imaging apparatuses as described hereinbefore, in which further, at least second compensation cycles are provided wich comprises the following additional steps:

d) comparing the effectively generated gradient field after the first compensation cycle with the target gradient field by determining the difference between the said ideal target gradient field and the said effectively generated gradient field;

e) defining a new field by adding the said difference defined at d) between the said ideal target gradient field and the said effectively generated gradient field to the effectively generated field measured before having carried out the first compensation cycle and calculating from the said new field the currents needed for generating a new compensated gradient field.

Further third or successives compensation cycles can be carried out substantially by repeating the said steps a) to e) until the effectively generated gradient field is equal to the target gradient field or the difference between the effectively generated gradient field and the target field is less than a predefined maximum error.

In the third or further repetition cycles the new field is calculated by adding the difference between the target field and the effectively generated field obtained by carrying out the second or preceding compensation cycle to the new fictive field calculated before carrying out the second or preceding compensation cycle. In this case, if after a compensation cycle the effectively generated gradient field has not reached the values of the target field, the effectively generated field being higher or lower for a certain value than the target gradient field, the new fictive field as calculated before carrying out the compensation cycle is respectively increased or decreased by the same certain value for which the effectively generated field obtained as a result of the compensation cycle is higher or lower than the target field according to a measurement carried out after the said compensation cycle and the next compensation cycle is carried out by using the said increased or decreased fictive field for computing the currents for generating the gradient fields. The above mentioned iteration adds at each certain cycle the difference between target field and compensated field to the sum of differences between this fields computed till this certain cycle.

In considering the above mentioned steps it is important to bear in mind that once a magnetic field is given than it is clear for an expert in the art how to calculate a current generating said field.

Furthermore it is important to consider that the gradient fields are time dependent fields as the currents for generating such fields, so that the meaning of target field, effectively generated target field, and differences between the said fields has to be read as being time dependent functions.

Therefore every step defined above needs to be carried out by detecting, comparing and calculating Differences of the fields at certain successive instants of the time dependent functions in a similar way like carrying out a discrete sampling of the fields and of the differences. Also this kind of carrying out the detecting of the fields and their Differences is a well known one for the expert in the art.

The above mentioned combination of steps corresponds to an algorithm which is simple and surely convergent with very few steps and which does not need complicated mathematical structures to be carried out except for the transformations needed to reversely compute the excitation currents from the new field.

The algorithm works only on the basis of the sequence of new fields computed and generated and to their difference from the target field.

A further improvement of the present invention is based on the time dependence of the gradient fields and on the fact that the eddy-currents effects are considerable during the switching on and switching off ramps of the gradient field by opposing to the switching on and to the switching off of the gradient fields. The relevant effects during switching on is that the gradient field reaches later than desired a certain value, while during switching off a certain field is still present when no gradient field is needed. The linear switching on and switching off ramps of the field are transformed by the eddy-currents in exponential functions with a slower growth and decay. In order to reduce the detection burden, this means measuring and sampling burden of the effectively generated gradient fields by sparing time for measuring and computing, the present invention suggests to consider the gradient fields only for certain periods and not for their entire duration by limiting this periods to a time window coincinding with the growth ramp for the switching on and to a time window starting from the istant where the target field would have been shut off, i.e., at zero value, to an instant where the difference between target field and effectively generated field is zero or lower than a predetermined maximum difference value of the said fields. These time windows coincide with the periods of the time dependent gradient fields during which the effects of the eddy currents have their major influence.

According to a further improvement the above mentioned method can be carried out by compensating separately the eddy currents effects on the gradient fields and on the static magnetic field, this is equivalent with separating the compensation of the eddy currents effects corresponding to the linear and zero order components of the magnetic field induced by the eddy currents.

Thus the invention provides for a method showing the following further steps f) carrying out a first compensation cycle as disclosed above under points d) to e) disclosed above, which compensation step is limited to the compensation of only the linear order components of the eddy currents induced magnetic field, i.e., the component acting on the gradient fields;

g) carrying out a second compensation cycle in which the magnetic field generated by gradient coils is detected in two different locations or two different areas or in two limited space volumes within the whole volume being considered, i.e., within the imaging area;

h) separating the linear and zero order components of the magnetic field by means of the said two detections;

i) carrying out a second compensation step of the linear order component of the effects induced by the eddy-currents according to the second compensation cycle of linear order components of the magnetic field disclosed above;

j) separately carrying out a first compensation step of the zero order component of the eddy currents induced magnetic field by mean of a comparison between target zero order components and the effectively generated zero order components of the magnetic field which corresponds to the difference between target and effectively generated zero order components A second compensation cycle of the zero order components of the magnetic field may be carried out in a similar way as disclosed before for the gradient field. In particular the following steps are provided:

k) comparing the effectively generated zero order component after the first compensation cycle with the target zero order component by determining the difference between the said target zero order components and the said effectively generated zero order components of the magnetic field;

l) defining a new fictive zero order components of the magnetic field by adding the said difference defined at k) between the said target zero order components of the magnetic and the said, effectively generated zero order components of the magnetic field to the effectively generated zero order components of the magnetic field measured before having carried out the first compensation cycle and calculating from the said new fictive zero order component of the magnetic field the currents needed for generating a new compensated zero order components of the magnetic field.

Further third or successives compensation cycles can be carried out substantially by repeating the said steps k) to l) until the effectively generated zero order components of the magnetic field is equal to the target zero order components of the magnetic field or the difference between the effectively generated zero order components of the magnetic field and the target zero order component of the magnetic field is less than a predefined maximum error.

If after a certain number of compensation cycles the linear order components of the magnetic field induced by the eddy current has been compensated within the requested precision, while the zero order components are not, the invention allow to carry out further compensation steps only for the zero order component.

Therefore, the invention proposes to determine the linear and zero order components of the eddy current induced magnetic field and to compensate for each of these components in successive compensation cycles that are alternately referred to zero order and linear order components.

It was found that, if compensation was only limited to the linear component of the eddy current induced magnetic field, it would be only adequate in the imaging area, whereas it would not provide sufficient improvement effects in other magnetic field permeated space volumes.

Furthermore, it was found that any correction of or compensation for the linear components of the eddy current induced magnetic field also affects the zero order components of that eddy current induced magnetic field, wherefore a simultaneous compensation for the two zero order and linear components does not provide optimal results.

Due to the above, in a preferred embodiment, the invention includes:

In short, the compensation procedure provided by the invention allows to perform a first partial compensation for the linear components of the eddy current induced magnetic field and, after this first compensation cycle, a compensation for the zero order components that have been generated after the first linear component compensation cycle, and are detected in an intermediate detection step between the two compensation cycles.

Further detection and compensation steps may be provided for the residual components of the magnetic field, either of the zero or of the linear order, when eddy current effects have not been completely compensated for. These steps may be repeated until the desired accuracy is reached, with reference to the ideal theoretical behaviour.

It is important to notice that for each compensation cycle only two detections, i.e., measurements of the magnetic field during switching on and off of the gradient coils and for each spatial directions has to be carried out, for obtaining the measured values of the liner order and zero order components of the magnetic field effects induced by the edy currents. It is not necessary to measure separately the gradient fields and the static magnetic field in order to carry out the compensation. Thus a reduced number of detection, i.e., measurements has to be carried out.

In the above method a compensation for the linear components of the gradient field is always executed first, and is followed by a subsequent step for compensating the zero order components detected after the execution of the previous linear component compensation step.

In a further variant of the method, the compensations of the linear order components and of the zero order components of the magnetic effects induced by the eddy currents can be in the form of a weighted combination of the individual compensations.

As far as implementation is concerned, the compensation for the linear components of the magnetic field generated by the currents induced by the gradient coil magnetic field is obtained by appropriately modifying the excitation currents in magnetic field generating gradient coils, for instance by combining a current, that varies in time according to an inverse function of the eddy current time course describing function, with the gradient coil exciting current, or by appropriately modifying the time course of the latter.

The compensation for zero order components of the magnetic field generated by the currents induced by the gradient field is obtained by using compensation coils associated to the magnetic structure, e.g. placed near the poles thereof.

The magnetic field generated by gradient coils in a predetermined space volume may be detected by using detection coils or in another manner.

As an alternative to detection coils, detection may be performed, in a NMR imaging apparatus, with the help of a phantom having an elongated size, and so that, in the imaging volume of the apparatus, magnetic resonance signals may be acquired for two different phantom slices, by using typical receive signals of the apparatus and comparing them with theoretical or actual data. This comparison allows to determine the courses of the fields generated by the gradient coils or by one of them and a comparison with the theoretical course of the gradient fields allows to determine the zero order and linear components of the eddy current induced field.

Here, the zero order and linear components are obtained from the courses of the magnetic field in two slices of the phantom, by performing an addition and a subtraction of the two courses respectively.

Magnetic resonance signals may be detected in two slices of the phantom.

Particularly, in this case the method includes the following steps:

measuring the actual course of the magnetic field by means of at least two signal detections on a phantom, performed in areas or along slice planes of the phantom in different positions relative thereto.

determining the linear components of the eddy current induced magnetic field of one or all gradient coils, by using the difference of the actual courses of the magnetic fields of one or all gradient coils detected for each of the at least two slice planes;

determining the zero order component of the eddy current induced magnetic field by adding the actual courses of the gradient fields detected for each of the at least two slice planes;

determining an eddy current compensating current, to be combined to the gradient coil exciting current in a first cycle of compensation for the linear component of the eddy current induced magnetic field;

measuring again the course of the magnetic field and determining the course of the magnetic field of one or all gradient coils by at least two signal detections on a phantom, performed in areas or along slice planes of the phantom in different positions relative thereto;

determining the eddy current-induced zero order component of the magnetic field of one or all gradient coils, by adding the actual courses of the gradient fields detected for each of the at least two slice planes;

determining a compensation field generating current, having a zero order symmetry, to be applied to compensation coils disposed in the magnetic field permeated volume and possibly associated to the magnetic structure.

Thanks to the above, an accurate eddy current compensation may be obtained, which is applicable and effective in the whole magnetic field permeated volume and substantially, with reference to NMR imaging apparatus, in the whole imaging volume. Correction may be refined within the accuracy limits of the detection instruments and the repetition of compensation cycles may be anyway limited to the attainment of a compensation accuracy within predetermined tolerances of differences between nominal values, i.e., the theoretical or desired values and the actual values.

The method of the present invention shall not be considered to be limited to linear or zero order component compensation, although in normal practical and field applications of Magnetic Resonance, this seems to be sufficient to obtain optimal imaging conditions.

However, nonlinear terms may be also considered, when this is required by a specific application having higher accuracy requirements or when these nonlinear components are critical for proper operation.

The above method is not only advantageous for correction of or compensation for eddy current effects in closed magnets, but also for correction of or compensation for these effects In open magnets or highly asymmetric magnets.

The correction of magnet field generating currents in gradient coils may be automated in a relatively simple manner by using the phantom signal processing means available in the apparatus. Similarly, this is also possible for the correction of or compensation for zero order components. In this case, the zero order components are compensated for by using the static field correction coils available in the magnetic structure for other compensation purposes, e.g. for compensating for noise outside the main field.

By using correction elements of the type composed of excitable coils, the spatial course and/or the time course of this noise may be also accounted for.

Subsequent compensation cycles, comprising substantially the same steps as the first compensation cycle may be executed either in the same manner as shown for the steps of the first compensation cycle or with simultaneous and combined correction of the linear and zero order components.

The invention provides further improvements which will form the subject of the appended claims.

BRIEF DESCRIPTION OF THE DRAWINGS

The characteristics of the invention and the advantages derived therefrom will appear more clearly from the following description of a non limiting embodiment, on the basis of the annexed drawings, in which.

DETAILED DESCRIPTION OF THE PREFERRED EMBODIMENTS

Figure 4:
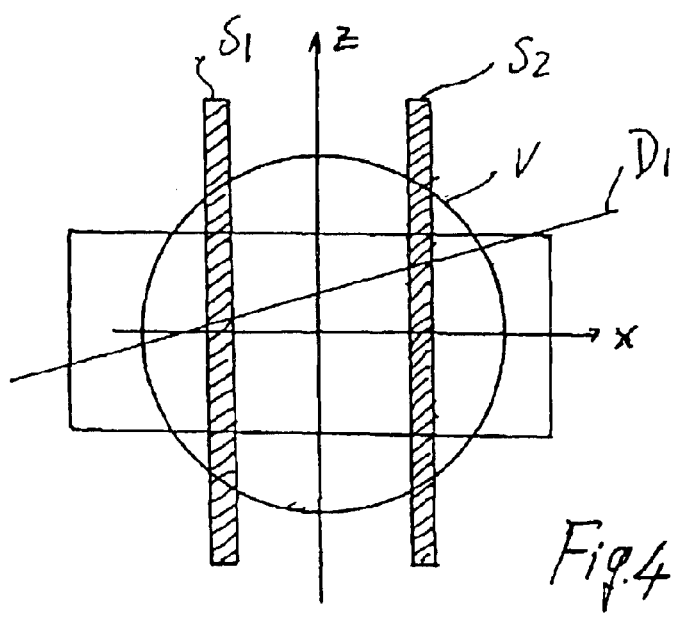
FIG. 4 shows the two detection slices with reference to the imaging volume of the NMR imaging apparatus and with reference to a Cartesian reference system, the Figure also shows the course of the magnetic field generated by the gradient coil in the x direction and also including that of the induced currents generated thereby in the imaging area at the instant t1 and with reference to the direction X and to the zero order component (which determines a field offset).

This description relates to the magnetic field generated by a single gradient coil, in a single dimension of a Cartesian space defining system for the Magnetic Resonance imaging volume, denoted by V in FIG. 4.

The compensations relating to the other gradient coils, each with respect to its own direction in space, are substantially identical.

The course of the gradient field, as well as the eddy current induced linear and zero order components may be determined by using, for instance, two detection coils positioned in different areas of a space volume permeated by this field. In this case, the time course of the induction coil signal is acquired.

Alternatively, and as will be described in detail hereafter, when this operation is performed in a NMR imaging apparatus, the apparatus has means for determining such a course, the latter being extrapolated from the Magnetic Resonance signals of a phantom, particularly in two different slices S1 and S2 of this phantom.

By placing the phantom in a predetermined position within the imaging volume of the NMR imaging apparatus, the course of the magnetic field generated by the gradient coil and by induced currents may be extrapolated by back-step calculations on the time-dependent detected signal.

Figure 1:
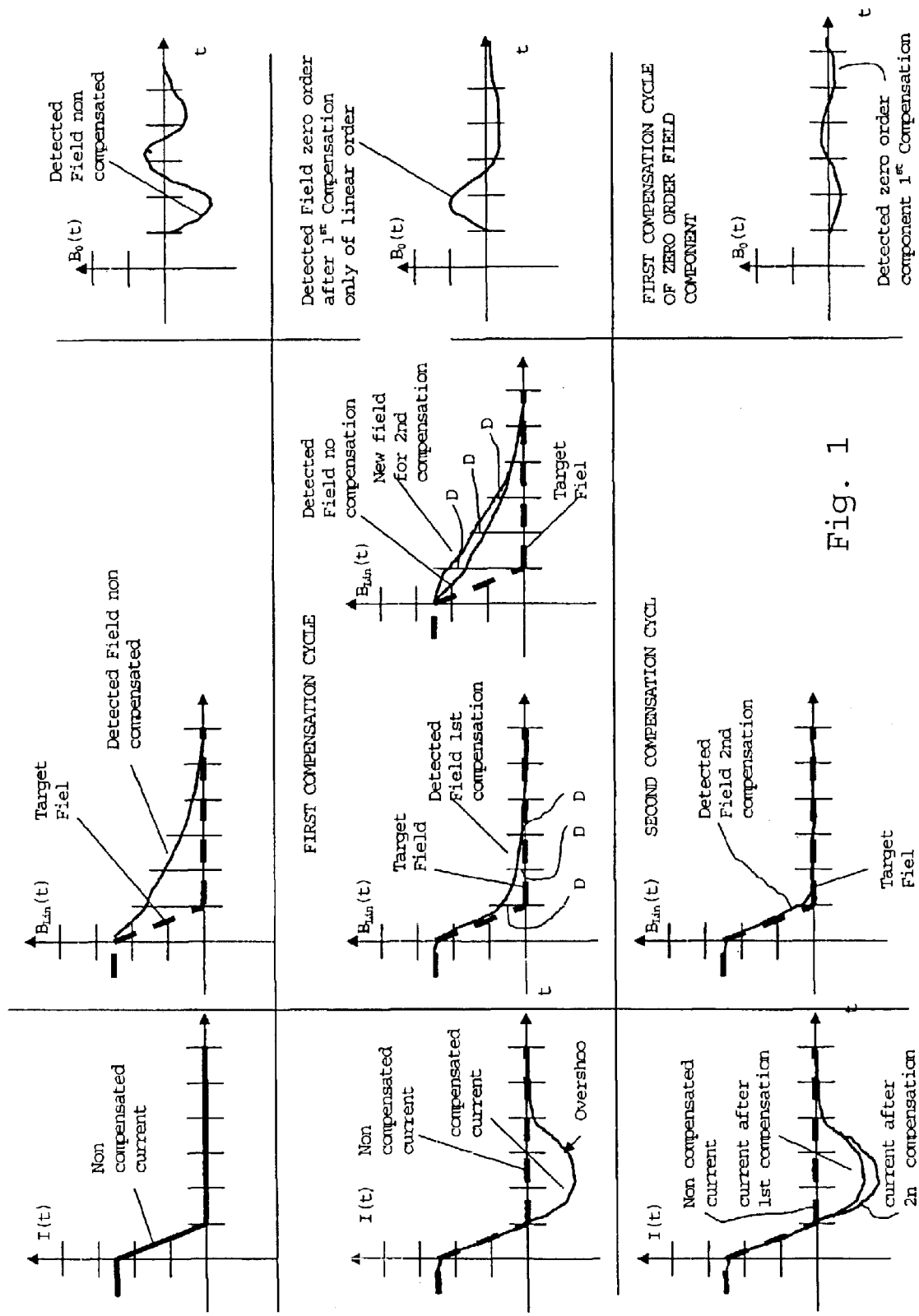
FIG. 1 and FIG. 2 show by mean of a table of schematic diagrams the iterative compensation method according to the invention in the preferred embodiment in which the linear order component of the magnetic field due to eddy currents are compensated separately from the zero order component limited to the switching off windows of the gradient fields.
Figure 2:
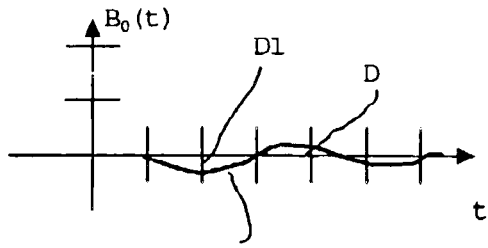
Figure 2:
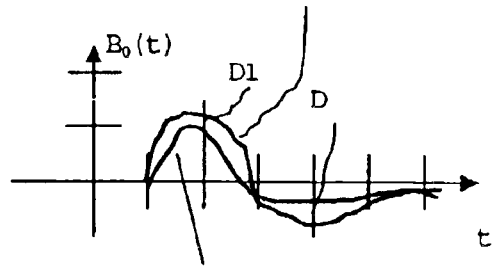
Figure 2:
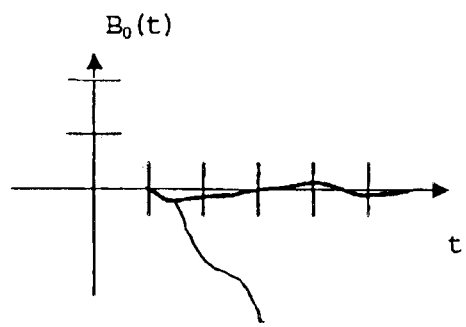

Referring now to FIGS. 1 and 2 the iterative compensation method of the effects on the magnetic field induced by eddy currents during pulsed excitation of the gradient coils for a gradient field in the direction of the x-component of a Cartesian system describing the space is shown according to a preferred embodiment in which linear order component of the magnetic field effects induced by eddy current are compensated separately form the zero order component.

The lefthand column of the table shows the currents at the switching off ramp of the gradient field respectively without taking into account the eddy current effects, after the first compensation cycle of the linear order component of the effects on the magnetic field due to the eddy currents, this means of the effects of the eddy currents on the gradient field, and after a second compensation cycle.

The example shown is purely theoretical and indicative and for sake of clarity it is presumed that only two iterations of the cycle are sufficient to ensure a satisfying compensation of the effects.of the eddy currents on the gradient field.

The central column shows the detected magnetic gradient field corresponding to the lefthand current.

The second line of the central column shows how the effective generated and detected or measured field after the first compensation cycle is used for computing a new fictive field from which in the second compensation cycle the gradient field excitation current is computed which increases the precision of the compensation.

The third column illustrates the compensation cycles of the eddy currents effects on the zero order component of the magnetic field which is carried out separately from the compensation cycles for the eddy currents effects on the gradient fields.

At the beginning as shown in the first line of the table of FIG. 1, the theoretical current for exciting the gradient coils is applied. This current is indicated as "non compensated current". The central column shows the effectively detected non compensated gradient field this means the gradient field obtained without compensation of the effects due to eddy currents and with discontinuous lines the target gradient field, which one could expect by exciting the gradient coil if no eddy current effect would arise.

The right hand column shows the effectively generated zero order component during the switching off ramp of the gradient coil.

Central line shows the first compensation cycle. Basing on the difference between the target gradient field and the effectively generated non compensated gradient field a compensated excitation current is computed. This excitation current is shown at the left hand column of the second line of the table of FIG. 1 and is indicated as "compensated current".

It is important to stress out that although from the mathematical and computational point of view the computation of the new excitation current for compensating the effects of the eddy currents on the gradient field from the magnetic fields is not simple, once a magnetic field is given, this means the time dependent function describing a magnetic field, the expert in the art is able to determine the current for exciting a predetermined coil desing which is necessary for generating the said field by means of its general knowledge.

Once the new compensated current according to the first compensation cycle has been determined the effectively generated field by this compensated current is determined by applying it to the gradient coil and measuring or detecting the corresponding field.

As it appears clearly from the diagram showing the gradient coil excitation current after the first compensation cycle indicated as "compensated current" in the lefthand column of the second line of the table of FIG. 1, this current shows a negative overshoot in the time interval after the decaying ramp has reached the zero value for the non compensated current. The said time interval corresponds to the time interval in which the effectively generated linear component of the magnetic field (gradient field) detected by applying the "non compensated current" (left hand column of line one) is still higher than the target linear component of the magnetic field.

The central column of the second line of the table of FIG. 1 shows two diagrams corresponding to two steps. The first one is the detecting or measuring step of the effectively generated linear component of the magnetic field (gradient field) generated by the computed "compensated current" according to the first compensation cycle. The second step corresponds to the step of defining a new fictive linear component of the magnetic field which takes into account the differences still existing between the effectively generated gradient field generated by the first compensation cycle and the target field. As it appears clearly from the said two diagrams, the differences between the effectively generated gradient field by means of the "compensated excitation current" and the target field are added to the effectively generated field obtained by means of the "non compensated" excitation current. This Differences are indicated at different instants with D1, D2, D3.

This new fictive gradient field is used for computing a new compensated current in the following second compensation cycle of the effects of the eddy currents on the linear order components of the magnetic field, this means of the gradient field.

The effect of this steps is indicated in the left hand column of the third line of the table of FIG. 1. There the diagram shows the gradient field excitation current after the first compensation cycle which is the one shown in the diagram of the left hand column of the second line of the table of FIG. 1 and the gradient field excitation current obtained by the second compensation cycle. The central column of the third line of the table shows the linear component of the magnetic field, this means the gradient field obtained after the second compensation cycle in comparison with the target field illustrated with discontinuous lines.

In the fiction of the present example it is presumed that two compensation cycles are sufficient for obtaining a satisfacting compensation. Nevertheless if a further compensation cycle of the linear order components would be necessary the further described compensation steps has to be repeated. In this case the differences between the linear component of the effectively generated field by the excitation currents obtained carrying out the second compensation cycle and the target field are added to the new fictive field on the basis of which the second compensation cycle has been carried out and which has been computed after the first compensation cycle and before carrying out the second compensation cycle. This new fictive gradient field contains the sum of the Differences of the effectively generated gradient filed as generated on the basis of the first and second compensation cycles with respect to the target gradient field. The said new fictive gradient fields is used a basis for carrying out the third compensation cycle. For further compensation cycles the above scheme is applied correspondingly.

From the above it appears clearly that at each compensation cycle the difference still existing between the effectively generated gradient field obtained by means of the compensated current in the corresponding cycle is taken into consideration for further reducing this difference in the next compensation cycle.

Looking at the diagram showing both the current after the first compensation cycle and the current after the second compensation cycle it appears evident that the new linear component of the field has determined an increased overshoot for the gradient field excitation current as obtained in the second compensation cycle.

It is also to be stressed out that the magnetic field components are discretely sampled by determining their value at certain instants which are determined by a time basis according to any of the known sampling techniques.

It is also to be stressed out that in order to reduce the sampling and computing burden, the sampling begins at the time istant coinciding with the instant at which the decaying ramp of the target field has to reach its zero value or its minimum.

This apply also to the detection and measuring of the eddy currents effects on the magnetic field components of zero order, i.e., on the static magnetic field.

According to the right hand column of the table of FIG. 1, the first compensation cycle of the effects of the eddy-current on the zero order components of the magnetic field is carried out with a delay of one cycle with respect to the compensation of the effects of the eddy currents on the linear components i.e. on the gradient fields.

In this case the first compensation cycle of the eddy currents effects on the zero order field components begins at the stage where the second compensation cycle of the effects of the eddy currents on the linear components of the magnetic field are carried out and according to this example after this second compensation cycle has been carried out or at the same time.

The compensation cycle of the zero order components of the magnetic field is carried out in exactly the same manner as described for the linear components of the magnetic field.

As it will be explained later on with greater detail for determining the linear component and the zero order component of the effectively generated magnetic field out of the measurements of this effectively generated magnetic field only two measurements in different locations or points of the space permeated by the magnetic field are necessary. Thus no separate measurement of the zero order component of the magnetic field is necessary for carrying out the compensation cycles.

In the present example, the time dependence of the zero order components of the target magnetic field is presumed to be a field being constant in time and having zero value. Obviously this is only a choice made for sake of simplicity in the present theoretical example. The zero order magnetic field can also be a field constant in time having a non zero value. The steps of the compensation cycles described and the principle of these steps is not affected by different choices of the values of the target zero order component of the magnetic field.

Again a time dependent current is determined by computing it from the differences between the effectively detected zero order components of the magnetic field and the target zero order components of the magnetic field. The right hand column of the table of FIG. 1 shows in the first line the effectively detected zero order component of the magnetic field in absence of compensation. In the second line the effectively detected zero order components of the magnetic field is shown after having carried out the first compensation cycle of the gradient magnetic field, i.e., the linear order components of the magnetic field. The third line of the right hand column shows the detected effectively generated zero order component of the magnetic field after having carried out the first compensation cycle.

The reason for delaying the first compensation cycle of the eddy current effects on the zero order components of the magnetic field with respect to the first compensation cycle of the effects of the eddy currents on the gradient fields appears clearly form the left hand diagram of the compensate excitation currents for the gradient fields. The first compensation cycle furnishes an excitation current which has considerable differences from the non compensated current, while the second and eventually further compensation cycles of the linear components of the magnetic field introduce only slight changes of the compensated excitation currents.

Thus carrying out the first compensation step of the effect of the eddy currents on the zero order component of the magnetic field at the same tile as the first compensation step of the linear components would mean to determine the compensation of the eddy current on a very different effective zero order component of the magnetic field if compared to the one detected after the first compensation cycle of the linear components of the magnetic field leading so to a not precise compensation.

The diagrams of FIG. 2 illustrate the second compensation cycle of the effects of the eddy currents on the zero order components of the magnetic field. In a similar way as to the computation of a new field in the second compensation cycle of the gradient field, a new zero order component is determined by adding to the zero order component detected before the first compensation step or to anew field determined before having carried out a previous compensation step the differences between the zero order component of the field obtained by means of the first or the last compensation step carried out and the target zero order components of the magnetic fields. This differences are indicated with D1 and D2 in the first diagram of FIG. 2. The new zero order component of the magnetic field are illustrated in the second diagram where also zero order components detected before having carried out the previous compensation step are indicated. In the case of the present example the second compensation step is carried out so that the differences D1 and D2 between the zero order field components detected after having carried out the first compensation step and the target zero order components of the field are added to the zero roder components of the field as detected before having carried out the first compensation cycle.

The third diagram shows the zero order component of the magnetic field detected after having carried out the second compensation cycle. The example does not show further steps since it is fictively presumed that only two steps are sufficient for satisfying the precision of the compensation. Nevertheless further compensation steps can be alternatively carried out by repeating the before mentioned steps in a similar way as disclosed for the gradient field compensation cycles.

It is also to be appreciated that the compensation cycle of the linear components have been stopped at the level of the second cycle, so that the second compensation step of the zero order components has been carried out only for this components.

If needed in parallel of before carrying out the said second compensation cycle of the effects of the eddy currents on the zero order components of the magnetic field a third compensation cycle of the effects of the eddy currents on the linear order components of the magnetic field could be carried out if needed.

While the compensation cycles of the effects of the eddy currents on the linear components of the magnetic field furnishes a modified excitation current of the gradient fields to be fed to the gradient coils, the compensation cycles of the eddy currents effect on the zero order components of the magnetic field may furnish a current which has to be superimposed to a static magnetic field excitation current fed to the static magnetic field generation coils or a compensation current which is fed to compensation coils. This last option is used for example when the static magnetic field is generated by means of a permanent magnet, while the first mentioned option can be applied particularly where the static magnetic field is generated by a resistive magnet or by a superconducting magnet.

In the following description the way of detecting and separating the zero order magnetic field components and the linear order components of the magnetic field is disclosed in deeper detail.

Figure 3:
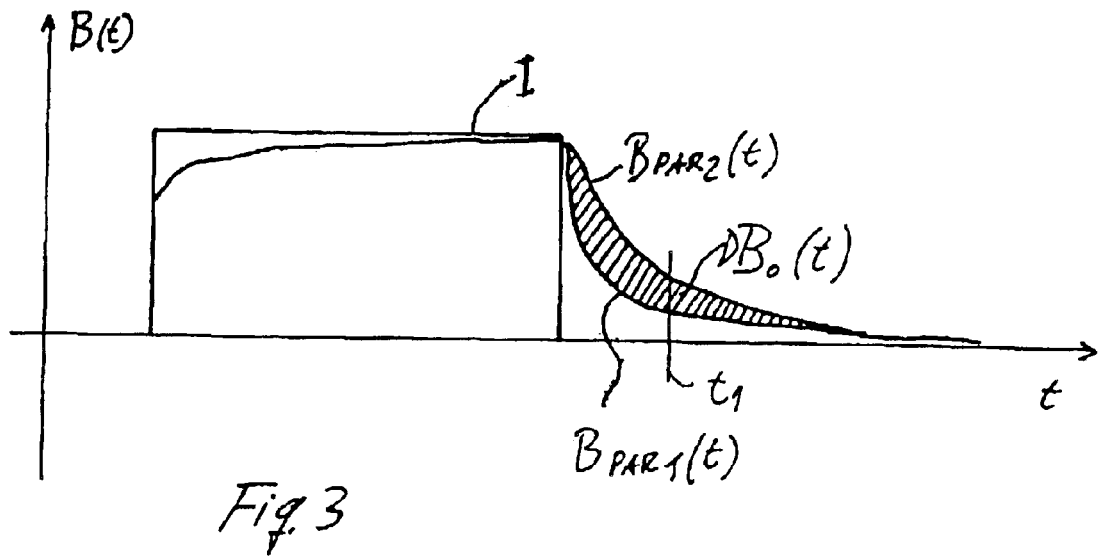
FIG. 3 shows the course of the magnetic field of a gradient coil in time, both in the ideal condition and when eddy currents are present, and based on magnetic resonance signals excited in two different slices of a phantom.

Referring to FIG. 3, I denotes the ideal course of the magnetic field gradient which, in optimal conditions, must have vertical or relatively steep switching on and off fronts (a finite transition time is usually considered, hence the ideal course has a trapezoid shape).

Bpar1(t) and Bpar2(t) denote the courses of the switch off front of the field gradient detected in the two different slices S1 and S2 that are not ideal due to the presence of the eddy currents induced by the switching off of the magnetic field gradient.

FIG. 4 shows a useful Magnetic resonance imaging volume, generated in a magnetic structure cavity of a NMR imaging apparatus. Here, the straight line D1 shows the course of the magnetic field generated by the gradient coil X, also comprising that of the induced currents generated thereby in the imaging area at the instant t1 and with reference to the direction X. It shall be noted that eddy currents generate a field whose zero order component has an offset effect on the static field B0 of the magnetic structure, providing a change of strength of the latter in time and a change in space. If no eddy current were present, the straight line D1 would pass through the origin of the Cartesian system.

In FIG. 3, the zero order component of the magnetic field generated by gradient coils is defined by the difference between the two courses Bpar1(t) and Bpar2(t), i.e., by the hatched area indicated with DB0(t).

The eddy current induced linear component of the gradient field chamfers or rounds the fronts of the field course with respect to the ideal course in time, and this causes a delay in the attainment of the desired magnetic field value.

When considering a mathematical description of the eddy current induced field, which consists of a polynomial expansion with a power series with respect to one of the space coordinates x, with reference to the two slices S1 and S2, and only accounting for the terms with 0 and 1 exponents, we have:

$$B\_S1(t) = Bideal1(t) + Bpar1(t)$$

$$B\_S1(t) = Bideal1(t) + Bpar1(t)$$

With

B_Si=total field detected in the slice i,

Bideal(t)=(field gradient generated in the x direction)x

Bpar=(zero order component)(t)x^0+(one order component)(t)x^1

The curve of the actually acquired field B_S with the detected signal is composed of the course or signal of the ideal field (Bideal) and of the eddy current field (Bpar); the acquired signals B_S1, B_S2 are used to separate the 0 order and 1 order components of the eddy current.

Moreover, if the slices 1 and 2 are symmetric with respect to the center of the gradient under examination, the signals B_S1 and B_S2 have opposite signs and equal modules in the steady state, thereby providing the separation of the two eddy current effects on the field gradient and on the static field by simply performing the subtraction B_S1(t)−B_S2(t) and the addition B_S1(t)+B_S2(t) of the two courses.

Figure 5:
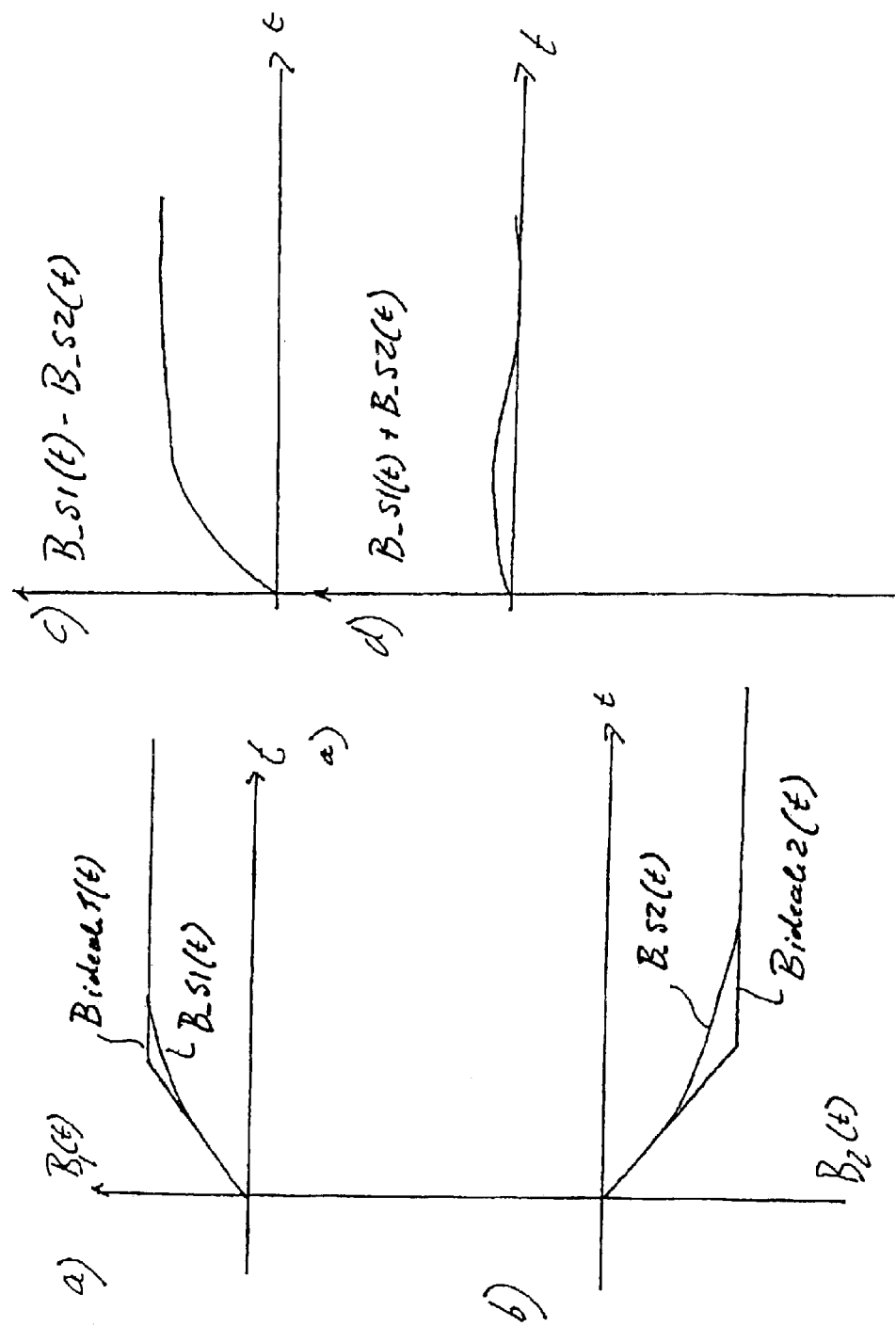
FIG. 5 shows the course of the field detected in the two phantom slices, and its breakdown in linear and zero order terms.

In FIG. 5, diagram 5a shows the courses of the magnetic field of the gradient coil in the non compensated eddy current condition. Diagrams 5d and 5c show the effects of the addition and subtraction operation B_S1(t)−B_S2(t) of the two courses detected at different locations of the space volume permeated by the gradient field, i.e., the determination of the zero order component and of the linear component with respect to the space variable or component.

The above addition and subtraction functions allow to determine an eddy current effect compensating current with respect to both zero order components and linear components.

Nevertheless, according to the invention, compensation for the zero order of the eddy current induced magnetic field is only determined after a first linear component compensation step.

The first correction step only provides for the compensation of eddy current effects on the gradient field relative to the linear terms, by generating a current CGrad1, which is determined by the course of B_S1−B_S2.

Generally, the current Cgrad1 is substantially obtained as an inverse function of the current adapted to generate the field B_S1−B_S2. A detailed description of an exemplified procedure for determining the current Cgrad1 from the course B_S1−B_S2 is described in IEEE Transactions on Medical Imaging, Vol. 7, No. 3, September 1988, which shall be intended as a part hereof.

This current is added or combined to the gradient field generating current, whereby the actual time course of the gradient field is closer to the ideal and theoretical course.

The step for determining eddy current effects on the magnetic field generated by the gradient coil, relative to the zero order component, and the consequent compensation for this component requires first a second detection step to detect Magnetic Resonance signals in the two slices S1 and S2 of the phantom, and then the execution of the addition B_S1+B_S2 wherefrom a compensation current Cb0(t) may be determined.

However, this compensation current is not applied to the gradient coil, but to compensation coils which, in the specific NMR imaging apparatus application, may be associated to the poles of the magnetic structure.

Thanks to the above, eddy current effects on the magnetic field, e.g. in a NMR imaging apparatus were compensated for in an at least partial compensation step, in which linear and zero order components of the gradient field are compensated for. This allows to account for the effect produced by the gradient field linear component compensation on the zero order component, whereby the value B_S1+B_S2, which describes the course of the eddy current effect relative to said zero order component, and which causes a sort of time-varying offset of the magnetic field, is detected on the basis of the gradient field course in the two slices S1 and S2 of the phantom only when the linear component has been compensated for, i.e., when the compensation current for the linear component has been determined and generated.

As already disclosed above any correction of or compensation for the zero order component of the eddy current induced magnetic field of the gradient coil, performed before the preliminary linear component compensation step on the same magnetic field would not be correct or accurate, the compensation for the linear component having been found to affect also the zero order component.

A compensation cycle may be defined which includes the above listed and described compensation steps. This cycle may be repeated wholly or partly once or several times to reach more accurate compensation levels.

In the subsequent compensation cycles, compensation steps may follow the pattern of the first preliminary compensation step, whereby the residual eddy current effects on the gradient field that have not been completely compensated for, relative to both zero order and linear components may be separately and alternately compensated for, or variants to these compensation steps may be provided. In this case, statistic or empiric weights may be possibly defined, to be multiplied by the compensations for the zero order and linear components of the subsequent cycles.

Alternatively, after executing the first compensation cycle, the compensations executed in the second and/or subsequent compensation cycles may provide parallel or separate compensation for the two zero order and linear order components, in this case by possibly appropriately weighting the different compensation components.

A further alternative execution of a second or subsequent compensation cycle may provide a joined compensation for eddy current induced zero order and linear components of the gradient field, i.e., without accounting for the different nature and mutual influence of the compensations on these two components, and treating them together.

The compensation currents determined in the second or subsequent compensation cycles may be directly combined with those determined in the previous compensation cycles or the different corrections of the compensation currents determined in the different successive compensation cycles may be combined with the compensation current determined in the first compensation cycle by an appropriate statistic weighting operation.

The compensation process which includes, as shown above, the steps of detecting the actual time courses of the gradient coil magnetic field, as changed by the generation of eddy currents, by exciting and detecting magnetic resonance signals in two slices of a phantom, may be performed in a substantially automatic manner by using a NMR imaging apparatus, provided that the memory thereof stores the theoretical data relative to the phantom detection and/or to ideal or theoretical courses of the gradient coil course.

Therefore, the apparatus can automatically determine the currents to be transmitted to the gradient coils and to the static field compensation coils, containing the compensation for eddy current effects.

Figure 6:
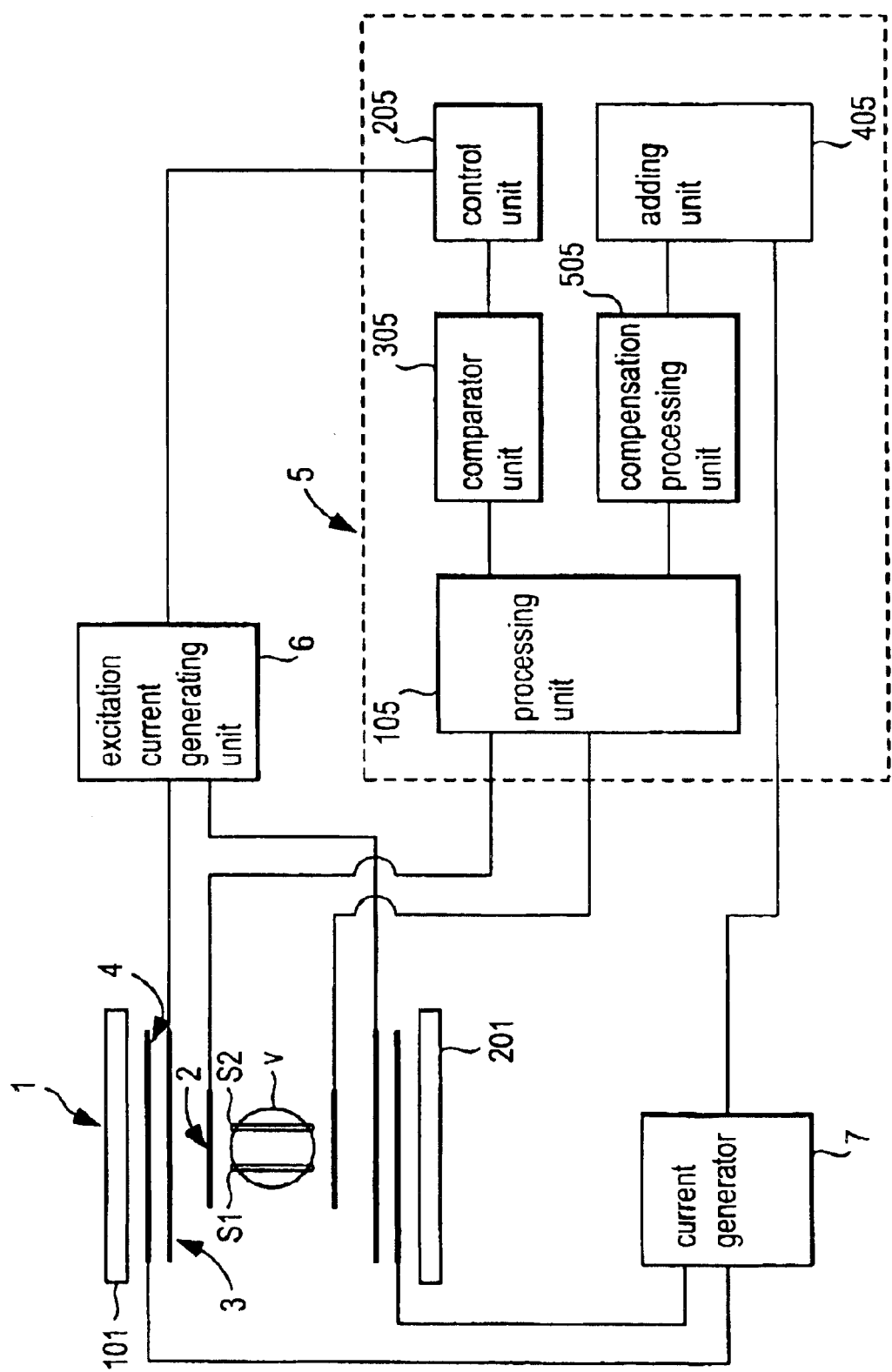
FIG. 6 is a block diagram of an eddy current effect detection and compensation unit.

An example of this apparatus is schematized in the block diagram of FIG. 6.

Here, numeral 1 generally denotes a magnetic structure, comprising two poles 101, 201, which enclose an imaging volume V and generate a static magnetic field denoted with B0 in the direction of the z axis of the coordinate system.

A phantom, identified by the two Magnetic Resonance signal detection slices S1 and S2 is introduced in the imaging volume V inside a receive coil 42 in which the Magnetic Resonance signals are acquired and transmitted to a processing unit 105 of the processing and control electronics 5 of the NMR imaging apparatus.

Moreover, the volume V is enclosed within gradient coils as schematized with numeral 3, whereas 4 generally denotes the static field B0 compensation coils.

Gradient coils are controlled, to generate the magnetic field and to select the slice S1 and S2 through the three space directions x, y, z, by an excitation current generating unit, denoted as 6. This unit is controlled by the processing electronics 5 of the apparatus and by a control unit 205.

The processing unit 105, whereto the receive coil 2 is connected, derives from the Magnetic Resonance signals the actual time course data of the magnetic field of the gradient coil/s in the two slices of the phantom and transmits them to a comparator unit 305 which performs the subtraction of said courses.

From this data, the unit 205 determines the compensation currents to be combined to those defined theoretically to generate the magnetic field of gradient coils, by modifying the gradient field generating current to obtain eddy current compensation.

The processing unit 105 also provides the actual data on gradient coil magnetic field courses to a unit for performing the addition of said courses, denoted with numeral 405, the sum being used to determine the zero order components of eddy currents. These signals are transmitted to a unit 505 which processes the compensation for these zero order components, and controls the unit 7 for generating the currents to be supplied to the compensation coil 4.

Although in FIG. 3 the different units are shown as specifically adapted to perform the functions designed therefor, said functions may be actually performed by properly programming the receive, processing and control units available in the apparatus, and recalled by appropriate programs and with possible small circuit integrations or changes to perform the specific eddy current effect detection and compensation current processing functions.

Although only preferred embodiments are specifically illustrated and described herein, it will be appreciated that many modifications and variations of the present invention are possible in light of the above teachings and within the purview of the appended claims without departing from the spirit and intended scope of the invention.

What is claimed is:

1. A method of compensating for eddy currents induced by the switching on and off magnetic fields in gradient coils in NMR imaging apparatuses, which method includes at least one compensation cycle comprising the following steps:
   a) Performing at least one detection of the magnetic field generated by the current flowing in a gradient coil, i.e., a gradient field
   b) Extrapolating the course of the effectively generated gradient field from the data of said at least one detection;
   c) Generating a gradient fields excitation current compensating eddy current effects on the gradient fields on the basis of a comparison of the effectively generated gradient fields and of a target gradient field;
   wherein at least a second compensation cycle is provided which comprises the following additional steps:
   d) comparing the effectively generated gradient field after the first compensation cycle with the target gradient field by determining the difference between the target gradient field and the effectively generated gradient field;
   e) defining a new fictive field by adding the difference defined at d) between the target gradient field and the effectively generated gradient field to the effectively generated field measured before having carried out the first compensation cycle and calculating from the new fictive field the currents needed for generating a new compensated gradient field.

2. A method according to claim 1, wherein that third or successive compensation cycles can be carried out by repeating the steps d) to e) until the effectively generated gradient field of the last carried out compensation cycle is equal to the target gradient field or the difference between the effectively generated gradient field and the target gradient field is less than a predefined maximum error.

3. A method according to claim 2, wherein that in the third or further repetition cycles the new fictive field is calculated by adding the difference between the target field and the effectively generated field obtained by carrying out the second or a preceding compensation cycle to the new fictive field calculated before carrying out the second or preceding compensation cycle.

4. A method according to claim 2, wherein that if after a compensation cycle the effectively generated gradient field has not reached the values of the target field, the effectively generated field being higher or lower for a certain value than the target gradient field, the new fictive field as calculated before carrying out the compensation cycle is respectively increased or decreased by the same certain value for which the effectively generated field obtained as a result of the compensation cycle is higher or lower than the target field according to a measurement carried out after the compensation cycle and the next compensation cycle is carried out by using the increased or decreased fictive field for computing the currents for generating the gradient fields.

5. A method according to claim 1, wherein the effectively generated magnetic fields are measured or detected by sampling the field with a predetermined sampling frequency.

6. A method according to claim 1, wherein the effectively generated magnetic fields are detected or measured only within limited period of time corresponding to a time window coinciding with the growth ramp for the switching on and to a time window starting from the instant where the target field would have reached its zero value or its minimum value to an instant where the difference between target field and effectively generated field is zero or lower than a predetermined maximum difference value of the fields.

7. A method according to claim 1, wherein the eddy currents effects on the gradient fields and on the static magnetic field are compensated separately by separating the compensation of the eddy currents effects on the linear order components and on the zero order components of the magnetic field induced by the eddy currents.

8. A method according to claim 7, wherein it comprises the following further steps:
   f) carrying out a first compensation cycle as disclosed above under points d) to e), which compensation cycle is limited to the compensation of only linear order components of the eddy currents induced magnetic field, i.e., the component acting on the gradient fields;
   g) carrying out a second compensation cycle in which the magnetic field generated by gradient coils is detected in two different locations or two different areas or in two limited space volumes within the whole volume being considered, i.e., within the imaging area;
   h) separating the linear and zero order components of the magnetic field by means of the two detections;
   i) carrying out a second compensation step of the linear order component of the effects induced by the eddy-currents by repeating the steps d) to e) until the effectively generated gradient field of the last carried out compensation cycle is equal to the target gradient field or the difference between the effectively generated gradient field and the target gradient field is less than a predefined maximum error;
   j) separately carrying out a first compensation step of the zero order component of the eddy currents induced magnetic field by means of a comparison between target zero order components and the effectively generated zero order components of the magnetic field which corresponds to the difference between target and effectively generated zero order components.

9. A method according to claim 8, wherein a second compensation cycle of the effects of the eddy currents on the zero order components of the magnetic field is carried out comprising the following steps
   k) comparing the effectively generated zero order component after the first compensation cycle with the target zero order component by determining the difference between the target zero order components and the effectively generated zero order components of the magnetic field;
   l) defining a new fictive zero order components of the magnetic field by adding the difference defined at k) between the target zero order components of the magnetic and the effectively generated zero order components of the magnetic field to the effectively generated zero order components of the magnetic field measured before having carried out the first compensation cycle and calculating from the new fictive zero order component of the magnetic field the currents needed for generating a new compensated zero order components of the magnetic field.

10. A method according to claim 9, wherein that third or successives compensation cycles can be carried out substantially by repeating the steps k) to l) until the effectively generated zero order components of the magnetic field is equal to the target zero order components of the magnetic field or the difference between the effectively generated zero order components of the magnetic field and the target zero order component of the magnetic field is less than a predefined maximum error.

11. A method according to claim 1, wherein that further compensation cycles are carried out only for the effects of the eddy currents on the zero order components of the magnetic field.

12. A method as claimed in claim 1, wherein that it includes:
   a first step in which eddy current effect compensation is only referred to the linear components of the magnetic field induced by eddy currents;
   a second step of detection and measurement of the actual course of the magnetic field of one or all gradient coils after the first compensation of the linear component of the eddy current induced field and of separate determination of the remaining zero order and possibly residual linear components of the eddy current induced field;
   a subsequent first zero order compensation step for compensating the zero order components of the eddy current induced magnetic field.

13. A method as claimed in claim 1, wherein that it includes further detection and compensation steps to compensate for the residual components of the magnetic field, either of the zero or of the linear order, when eddy current effects have not been completely compensated for, said steps being repeatable until the desired accuracy is reached, with reference to the ideal theoretical behaviour.

14. A method as claimed in claim 13, wherein that in said additional compensation cycles a compensation for the linear components of the gradient field is always executed first, and is followed by a subsequent cycle for compensating the zero order components detected after the execution of the previous linear component compensation step.

15. A method as claimed in claim 1, wherein the compensations performed after the first compensation cycles are multiplied by a weighting factor.

16. A method as claimed in claim 1, wherein the compensation cycles of the effects of the eddy currents on the zero order components of the magnetic field are delayed of one cycle with respect to the compensation cycles for compensating the effects of the eddy currents on the linear order components of the magnetic field.

17. A method as claimed in claim 1, wherein the compensation for the linear components of the magnetic field generated by the currents induced by the gradient coil magnetic field is obtained by modifying the excitation currents in magnetic field generating gradient coils, by combining a current, that varies in time according to an inverse function of the eddy current time course describing function, with the gradient coil exciting current, or by modifying the time course of the latter.

18. A method as claimed in claim 8, wherein the compensation for the effect of the eddy currents on the zero order components of the magnetic field is obtained by using compensation coils associated to the magnetic structure.

19. A method as claimed in claim 1, wherein the magnetic field generated by gradient coils in a predetermined space volume may be detected by using detection coils or in another manner.

20. A method as claimed in claim 1, wherein that detection may be performed, in a NMR imaging apparatus, with the help of a phantom having an elongated size, and so that, in the imaging volume of the apparatus, magnetic resonance signals are acquired for two different phantom slices, by using typical receive signals of the apparatus and comparing them with theoretical or actual data.

21. A method as claimed in claim 1, wherein the zero order and linear components are obtained from the courses of the magnetic field in two slices of the phantom, by performing an addition and a subtraction of the two courses respectively.

22. A method as claimed in claim 1, wherein it includes the following steps:
measuring the actual course of the magnetic field by means of at least two signal detections on a phantom, performed in areas or along slice planes of the phantom in different positions relative thereto;
determining the linear components of the eddy current induced magnetic field by adding the actual courses of the gradient fields detected for each of the at least two slice planes;
determining an eddy current compensating current, to be combined to the gradient coil exciting current in a first cycle of compensation for the linear component of the eddy current induced magnetic field;
measuring the course of the magnetic field of one or all gradient coils by means of at least two signal detections on a phantom, performed in areas or along slice planes of the phantom in different positions relative thereto;
determining the zero order component of the magnetic field by adding the actual courses of the gradient fields detected for each of the at least two slice planes;
determining the eddy current-induced zero order component of the magnetic field of one or all gradient coils, by adding the actual courses of the gradient fields detected for each of the at least two slice planes;
determining a compensation field generating current, having a zero order symmetry, to be applied to compensation coils disposed in the magnetic field permeated volume and possibly associated to the magnetic structure.

23. Method as claimed in claim 1, wherein nonlinear terms are also considered in the determination of eddy current effect compensations, particularly on gradient coil magnetic fields.

24. Method of detecting and compensating for static field inhomogeneities introduced by magnetic structure asymmetries, including the steps of:
selecting at least two different and spaced Magnetic Resonance signal detection slices in a phantom positioned in the imaging volume of a NMR imaging apparatus;
detecting Magnetic Resonance signals in said two slices;
determining the difference between said Magnetic Resonance signals in said two slices to extract the static field contribution;
generating a current for compensating said dishomogeneities to be supplied to one or more compensation coils associated to the magnetic structure.

25. A method as claimed in claim 24, wherein the steps in which compensation currents are determined to execute the eddy current effect and magnetic structure in homogeneity compensation cycles are performed in an automatic compensation procedure.

26. A NMR imaging apparatus, comprising:
a magnetic structure for generating a static field;
gradient coils for generating a magnetic field that varies in time and/or direction;
signal receiving coils for receiving Magnetic Resonance signals;
static field compensation coils, associated to the magnetic structure;
a unit for receiving and processing Magnetic Resonance signals and for controlling the above mentioned units, i.e., at least the field gradient generating coils and the compensation coils;
wherein the receive, processing and control unit comprises:
means for processing Magnetic Resonance signals to detect the time courses of the gradient coil magnetic fields;
means for determining the signals that correspond to the difference and sum of the time courses of the gradient coil magnetic fields;
means for determining compensation currents to compensate for eddy current effects on the courses of magnetic fields and to compensate for eddy current effects on the static field as well as for controlling the units that generate the field generating currents and for generating the static compensation field excitation currents, to be supplied to the gradient coils and the static field compensation coils respectively.

27. An apparatus as claimed in claim 26, wherein the apparatus is provided in combination with a phantom having such an extension as to allow the selection and excitation of Magnetic Resonance signals in two different spaced phantom slices.

28. An apparatus as claimed in claim 26, wherein the means for processing Magnetic Resonance signals to extract therefrom the time courses of the gradient fields, the means for determining the signals that correspond to the difference and sum of the time courses of the gradient fields, the means for determining compensation currents to compensate for eddy current effects on the courses of gradient fields and to compensate for eddy current effects on the static field and for controlling the units that generate the gradient field generating currents and for generating static compensation field excitation currents, to be supplied to the gradient coils and the static field compensation coils, are programs for controlling a receive unit and/or a processing unit and or a control unit that are already available and used to detect, process and display Magnetic Resonance images.

* * * * *